(12) United States Patent
Hamada et al.

(10) Patent No.: US 10,026,760 B2
(45) Date of Patent: Jul. 17, 2018

(54) SUBSTRATE PROCESSING APPARATUS AND SUBSTRATE PROCESSING METHOD

(71) Applicant: SHIBAURA MECHATRONICS CORPORATION, Yokohama-shi (JP)

(72) Inventors: Koichi Hamada, Yokohama (JP); Nobuo Kobayashi, Yokohama (JP)

(73) Assignee: SHIBAURA MECHATRONICS CORPORATION, Yokohama-shi (JP)

( * ) Notice: Subject to any disclaimer, the term of this patent is extended or adjusted under 35 U.S.C. 154(b) by 0 days.

(21) Appl. No.: 14/777,694

(22) PCT Filed: Mar. 17, 2014

(86) PCT No.: PCT/JP2014/057088
§ 371 (c)(1),
(2) Date: Sep. 16, 2015

(87) PCT Pub. No.: WO2014/156754
PCT Pub. Date: Oct. 2, 2014

(65) Prior Publication Data
US 2016/0276379 A1 Sep. 22, 2016

(30) Foreign Application Priority Data

Mar. 29, 2013 (JP) .................................. 2013-073380
Mar. 12, 2014 (JP) .................................. 2014-048638

(51) Int. Cl.
*B08B 3/04* (2006.01)
*H01L 27/12* (2006.01)
(Continued)

(52) U.S. Cl.
CPC ............ *H01L 27/1296* (2013.01); *B08B 3/00* (2013.01); *B08B 3/02* (2013.01); *B08B 3/08* (2013.01);
(Continued)

(58) Field of Classification Search
None
See application file for complete search history.

(56) References Cited

U.S. PATENT DOCUMENTS

| 6,238,107 B1 | 5/2001 | Inada | |
| 2003/0029479 A1* | 2/2003 | Asano | ........................ B08B 1/04 134/18 |

(Continued)

FOREIGN PATENT DOCUMENTS

| CN | 1720106 A | 1/2006 |
| CN | 102412134 A | 4/2012 |

(Continued)

OTHER PUBLICATIONS

Computer translation of JP2014-082318 by Hashizume, published May 8, 2014.*

(Continued)

*Primary Examiner* — Mikhail Kornakov
*Assistant Examiner* — Ryan L. Coleman
(74) *Attorney, Agent, or Firm* — Oblon, McClelland, Maier & Neustadt, L.L.P.

(57) ABSTRACT

According to one embodiment, a substrate processing apparatus (1) includes: a support (4) configured to support a substrate (W); a rotation mechanism (5) configured to rotate the support (4) about an axis that crosses the substrate (W) supported by the support (4) as a rotation axis; a nozzle (6) configured to supply a treatment liquid to a surface of the substrate (W) on the support (4) being rotated by the rotation mechanism (5); a heater (8) configured to heat the substrate (W) supported by the support (4) at a distance from the substrate (W); and a movement mechanism (9) configured to move the heater (8) in directions toward and away from the substrate (W) supported by the support (4).

14 Claims, 3 Drawing Sheets

(51) Int. Cl.
*H01L 21/67* (2006.01)
*B08B 3/02* (2006.01)
*B08B 3/08* (2006.01)
*B08B 3/10* (2006.01)
*H01L 21/02* (2006.01)
*H01L 21/687* (2006.01)
*B08B 3/00* (2006.01)

(52) U.S. Cl.
CPC .......... *B08B 3/10* (2013.01); *H01L 21/02057* (2013.01); *H01L 21/67051* (2013.01); *H01L 21/67109* (2013.01); *H01L 21/67115* (2013.01); *H01L 21/67248* (2013.01); *H01L 21/68764* (2013.01)

(56) References Cited

U.S. PATENT DOCUMENTS

| | | | | |
|---|---|---|---|---|
| 2014/0231012 | A1* | 8/2014 | Hinode | C09K 13/04 156/345.23 |
| 2015/0258582 | A1* | 9/2015 | Hashizume | H01L 21/67051 156/345.15 |

FOREIGN PATENT DOCUMENTS

| | | | |
|---|---|---|---|
| CN | 102782807 A | | 11/2012 |
| CN | 103996620 A | | 8/2014 |
| JP | 63-81812 A | | 4/1988 |
| JP | 7-153752 A | | 6/1995 |
| JP | 9-134872 A | | 5/1997 |
| JP | 2005-32990 A | | 2/2005 |
| JP | 2005-142290 A | | 6/2005 |
| JP | 2012-169509 A | | 9/2012 |
| JP | 2014-082318 | * | 5/2014 |
| JP | 2014-157934 | * | 8/2014 |
| JP | 2014-157935 | * | 8/2014 |
| KR | 2000-0017366 A | | 3/2000 |

OTHER PUBLICATIONS

Computer translation of JP2014-157934 by Hinode, published Aug. 28, 2014.*
Computer translation of JP2014-157935 by Hinode, published Aug. 28, 2014.*
International Search Report dated Apr. 22, 2014 in PCT/JP14/057088 Filed Mar. 17, 2014.
Taiwanese Office Action with Search Report Issued in Taiwanese Application No. 103111250 Filed Jun. 26, 2015.
Chinese Office Action issued in Chinese Patent Application No. 201480017840.7 dated May 15, 2017.
Japanese Office Action issued in Japanese Patent Application No. 2014-048638 dated Jun. 6, 2017 (w/ English translation).
Office Action dated Jul. 18, 2016 in Korean Patent Application No. 10-2015-7025990 (with English language translation).
Combined Office Action and Search Report dated Dec. 1, 2016 in Chinese Patent Application No. 201480017840.7 (with partial unedited computer generated English translation and English translation of categories of cited documents).

* cited by examiner

SUBSTRATE PROCESSING APPARATUS AND SUBSTRATE PROCESSING METHOD

TECHNICAL FIELD

Embodiments described herein relate generally to a substrate processing apparatus and a substrate processing method.

BACKGROUND ART

A substrate processing apparatus is used in the process of manufacturing semiconductors, liquid crystal panels, and the like to supply a treatment liquid (e.g., resist stripping liquid, cleaning liquid, etc.) to a surface of a substrate, such as a wafer or a liquid crystal substrate, to thereby treat the surface.

Among such substrate processing apparatuses are those that rotate a substrate horizontally and supply a treatment liquid to a surface of the substrate from a nozzle facing near the center of the surface so that the treatment liquid is spread over the surface due to the centrifugal force of the rotation, thereby treating the surface. There has been proposed a substrate processing apparatus that performs such spinning operation (e.g., see Patent Document 1). The substrate processing apparatus heats the treatment liquid in advance by a heater, and also heats a chuck that holds the substrate by the heater to warm up the substrate. Then, the treatment liquid thus heated is supplied to the surface of the substrate.

PRIOR ART DOCUMENT

Patent Document

[Patent Document 1] Japanese Unexamined Patent Application Publication No. H9-134872

SUMMARY OF THE INVENTION

Problems to be Solved by the Invention

With the substrate processing apparatus that heats the chuck by the heater to warm the substrate as described above, the temperature of the treatment liquid can be maintained by keeping the temperature of the substrate constant. However, even if the heater temperature (heating temperature) is changed, the temperature of the treatment liquid does not change immediately. Therefore, it is difficult to apply a treatment to the substrate as well as adjusting (controlling) the temperature of the treatment liquid during the treatment.

For example, assuming that the substrate processing includes two steps in which high temperature treatment is switched to low temperature treatment, the low temperature treatment is performed after the high temperature treatment. In this case, the processing is interrupted until the temperature of the substrate drops from the high temperature to a predetermined value. Accordingly, the processing is not performed by a series of steps (the same recipe), and the processing time is correspondingly prolonged. Therefore, it is required to adjust the temperature of the treatment liquid quickly during the substrate processing.

An object of the present invention is to provide a substrate processing apparatus and a substrate processing method capable of adjusting the temperature of the treatment liquid quickly during substrate processing.

Means of Solving the Problems

According to one embodiment, a substrate processing apparatus includes: a support configured to support a substrate; a rotation mechanism configured to rotate the support about an axis that crosses the substrate supported by the support as a rotation axis; a nozzle configured to supply a treatment liquid to a surface of the substrate on the support being rotated by the rotation mechanism; a heater configured to heat the substrate supported by the support at a distance from the substrate; and a movement mechanism configured to move the heater in directions toward and away from the substrate supported by the support.

According to another embodiment, a substrate processing method includes: rotating a substrate, which faces a heater at a distance therefrom, in a horizontal plane; supplying a treatment liquid from a nozzle to a surface of the substrate being rotated; heating the substrate and the treatment liquid on the surface of the substrate by the heater; moving the heater away from the substrate; and heating the treatment liquid on the surface of the substrate at least, or the substrate and the treatment liquid on the surface of the substrate by the heater moved away from the substrate.

Effects of the Invention

According to the present invention, the temperature of the treatment liquid can be adjusted quickly during substrate processing.

MODES FOR CARRYING OUT THE INVENTION (First Embodiment)

A first embodiment will be described with reference to FIGS. 1 to 5.

Figure 1:
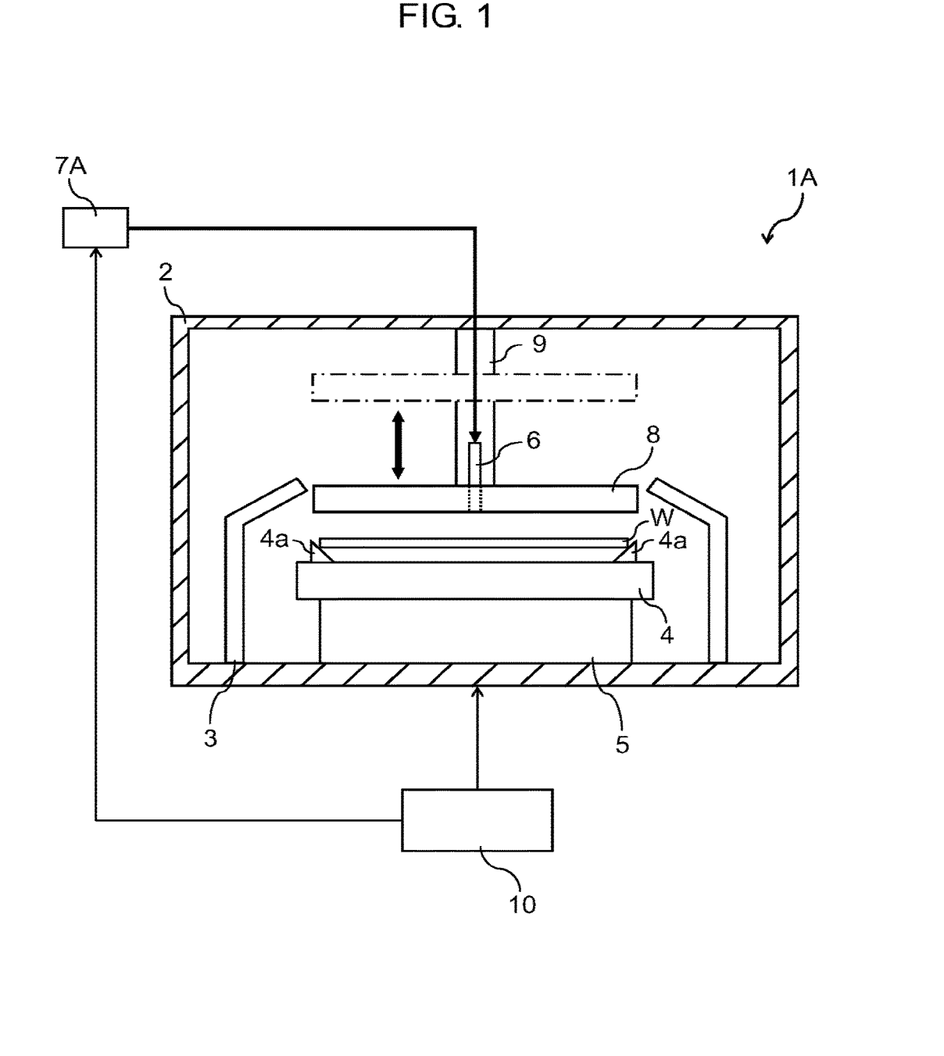
FIG. 1 is a diagram illustrating a schematic structure of a substrate processing apparatus according to a first embodiment.

As illustrated in FIG. 1, a substrate processing apparatus 1A of the first embodiment includes a treatment box 2 as a treatment chamber, a cup arranged in the treatment box 2, a support 4 configured to support a substrate W horizontally in the cup 3, and a rotation mechanism 5 configured to rotate the support 4 in a horizontal plane. The substrate processing apparatus 1A further includes a nozzle 6 configured to supply a treatment liquid to the surface of the substrate W on the support 4, a liquid supply unit 7A configured to supply the treatment liquid to the nozzle 6, a heater 8 configured to heat the substrate W on the support 4, a movement mechanism 9 configured to move the heater in the vertical direction, and a controller 10 configured to control each unit.

The cup 3 is formed in a cylindrical shape, and surrounds the periphery of the support 4 to accommodate it therein. The cup 3 includes a peripheral wall having an upper portion inclined inwardly in the radial direction, and an opening to expose the substrate W on the support 4. The cup 3 is configured to receive a treatment liquid flowing down or scattered from the rotating substrate W. Incidentally, the treatment liquid received is discharged through a discharge pipe (not illustrated) arranged in the bottom of the cup 3.

The support 4 is located near the center in the cup 3 to be rotatable in the horizontal plane. The support 4 includes a plurality of support members 4a such as pins. The support 4 removably holds the substrate W such as a wafer or a liquid crystal substrate by the support members 4a.

The rotation mechanism 5 includes a rotation shaft connected to the support 4 and a motor as a driving source to rotate the rotation shaft (both not illustrated). The rotation mechanism 5 rotates the support 4 via the rotation shaft by driving the motor. The rotation mechanism 5 is electrically connected to the controller 10, and operates under the control of the controller 10.

The nozzle 6 is arranged in a position facing near the center of the surface of the substrate W on the support 4 above the support 4 to be capable of supplying the treatment liquid to the surface of the substrate W on the support 4 from above. The nozzle 6 is supported in the center of the heater 8, and moves up and down together with the vertical movement of the heater 8. The nozzle 6 is supplied with the treatment liquid from the liquid supply unit 7A and ejects it toward the surface of the rotating substrate W on the support 4 from above the substrate W to supply the surface with the treatment liquid.

The liquid supply unit 7A includes a tank for storing the treatment liquid, a pump as a driving source, and a regulating valve for regulating the supply amount (all not illustrated). The liquid supply unit 7A supplies the nozzle 6 with a treatment liquid by the drive of the pump. The liquid supply unit 7A is electrically connected to the controller 10, and operates under the control of the controller 10.

For example, ozone water, hydrofluoric acid (HF), ultra-pure water (DIW) can be used as the treatment liquid. Various treatment liquids can be used according to the content of treatment.

The heater 8 is formed in a plate-like shape larger than the plane size of the substrate W. The heater 8 is arranged above the support 4 to heat the substrate W on the support 4 at a distance from the substrate W (spaced apart from the substrate W). The heater 8 is configured to be movable in the vertical direction (up and down directions) by the movement mechanism 9, and moves to a plurality of positions at different distances from the surface of the substrate W on the support 4. Examples of the positions include high temperature treatment position, temperature maintained treatment position (low temperature treatment position), and standby position. The heater 8 is electrically connected to the controller 10, and operates under the control of the controller 10.

The high temperature treatment position is at a predetermined distance from the surface of the substrate W (e.g., about 1 to 10 mm), and is a position at which the heater 8 heats the substrate W at a high temperature. The temperature maintained treatment position (low temperature treatment position) is more distant from the surface of the substrate W than the high temperature treatment position, and is a position at which the heater 8 maintains the temperature of the substrate W at a predetermined level. The standby position is more distant from the surface of the substrate W than the temperature maintained treatment position, and is a position at which the heater 8 is located when the substrate is placed or taken out (see chain line in FIG. 1).

The movement mechanism 9 includes a holder configured to hold the heater 8, a vertical mechanism configured to move the holder in the vertical direction together with the heater 8, and a motor as a driving source (all not illustrated). By driving the motor, the movement mechanism 9 moves the heater 8 together with the holder in directions to come close to and separate from (directions toward and away from) the substrate W on the support 4. The movement mechanism 9 is electrically connected to the controller 10, and operates under the control of the controller 10.

The controller 10 includes a microcomputer that centrally controls each unit, and a storage that stores various programs and substrate processing information related to substrate processing. The controller 10 controls the rotation mechanism 5, the liquid supply unit 7A, the movement mechanism 9, and the like based on the substrate processing information and the various programs to control the substrate processing. The substrate processing adjusts the distance between the surface of the substrate W on the support 4 and the heater 8, and supplies a treatment liquid supplied from the liquid supply unit 7A to the surface of the rotating substrate W on the support 4 from the nozzle 6.

A description will now be given of a first example and a second example of the substrate processing (substrate processing method) performed by the substrate processing apparatus 1A with reference to FIGS. 2 to 5. Note that it is herein assumed that the substrate W is set on the support 4, and pre-preparation has been completed. Besides, the heater 8 is waiting in the standby position (see chain line in FIG. 1).

Figure 2:
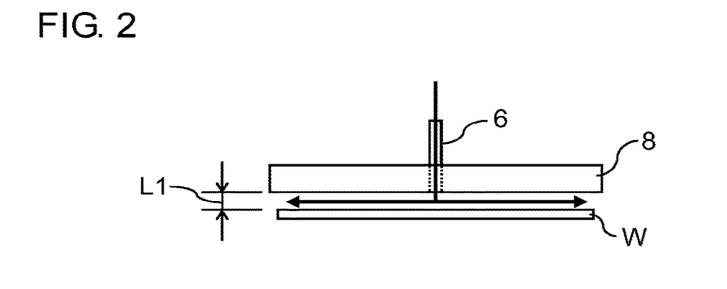
FIG. 2 is a diagram illustrating a first step for explaining the flow of substrate processing of the first embodiment.

In the first example, as illustrated in FIG. 2, the heater 8 is moved from the standby position to the high temperature treatment position by the movement mechanism 9. With this, the back surface of the heater 8 is separated from the surface of the substrate W on the support 4 by a predetermined distance L1. Incidentally, when moved from the standby position to the high temperature treatment position, the heater 8 is not driven. Then, the substrate W is rotated together with the support 4 at a predetermined rotational speed (liquid supply speed) by the rotation mechanism 5. Note that conditions such as the standby position, the high temperature treatment position, and the rotational speed are set in advance but can be changed by the operator.

After the stable rotation of the substrate W, the nozzle 6 is supplied with a treatment liquid from the liquid supply unit 7A and ejects it to the substrate W on the support 4. Thereby, the treatment liquid is supplied to the surface of the rotating substrate W. The treatment liquid supplied to near the center of the substrate from the nozzle 6 spreads to the edge of the substrate by centrifugal force. As a result, the surface of the substrate W is covered by the treatment liquid (liquid film) during the substrate processing.

Figure 3:
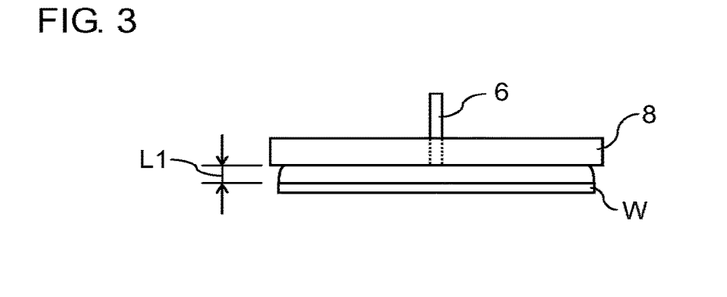
FIG. 3 is a diagram illustrating a second step for explaining the flow of the substrate processing of the first embodiment.

Thereafter, as illustrated in FIG. 3, the space between the back surface of the heater 8 and the surface of the substrate W on the support 4 is filled with the treatment liquid. Further, when the back surface of the heater 8 is in contact with the treatment liquid filled in the space, the supply of the treatment liquid is stopped. At this time, the substrate W on the support 4 is rotating at a rotational speed lower than the initial speed (liquid supply speed) so that the treatment liquid filled in the space is not flowing down therefrom. At this time, the rotation of the support 4 may be stopped.

After the supply of the treatment liquid is stopped, the heater 8 is driven by the controller 10. Accordingly, the heater 8 directly heats the treatment liquid between the back surface of the heater 8 and the surface of the substrate W on the support 4 as well as heating the substrate W on the support 4. Thus, the treatment liquid on the surface of the substrate W is quickly warmed. This heating is performed for a predetermined time.

The predetermined time is set in advance from the relationship between the heating time by the heater 8 and the temperature rise of the treatment liquid or the substrate W; however, it can be changed by the operator. Besides, as described above, in the high temperature treatment position, the treatment liquid may be supplied at room temperature, or it may be heated, before being supplied, to a certain temperature, even if not as high as required for the high temperature treatment. When having been pre-heated, the treatment liquid can be warmed more quickly to a temperature required for the high temperature treatment.

Figure 4:
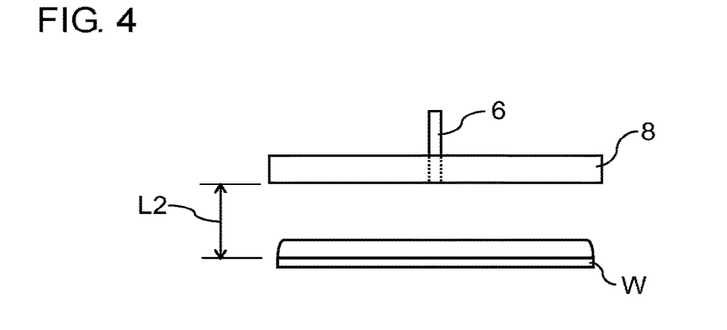
FIG. 4 is a diagram illustrating a third step for explaining the flow of substrate processing of the first embodiment.

After the high temperature treatment, as illustrated in FIG. 4, the heater 8 is moved from the high temperature treatment position to the temperature maintained treatment position by the movement mechanism 9. With this, the back surface of the heater 8 is separated from the surface of the substrate W on the support 4 by a predetermined distance L2 (>L1). Incidentally, when the heater 8 is positioned in the temperature maintained treatment position, the back surface of the heater 8 is separate from (not in contact with) the liquid film formed on the surface of the substrate W. At this time, the heater 8 is kept driven, and the substrate W on the support 4 and the treatment liquid on the surface of the substrate W are kept warm by the radiant heat of the heater 8. Thus, the substrate W is heated not to exceed a predetermined substrate temperature, and the treatment liquid on the surface of the substrate W is maintained at a desired temperature, i.e., maintained not to go above or below the desired temperature. At this time, the substrate W is also heated along with the treatment liquid. However, if the treatment liquid on the surface of the substrate W can be maintained at the desired temperature by heating only the treatment liquid, the heating of the substrate W may be dispensed with.

The predetermined substrate temperature is set such that the treatment liquid supplied to the surface of the substrate W has the desired temperature on the surface; however, it can be changed by the operator. In addition, the desired temperature is set to improve the substrate processing efficiency of the treatment liquid (e.g., the performance of the treatment liquid); it varies according to the type of the treatment liquid. Incidentally, there are some treatment liquids, the substrate processing efficiency of which is improved if heated to or above the desired temperature. In this case, the predetermined substrate temperature is set such that the treatment liquid supplied to the surface of the substrate W has the desired temperature or higher on the surface.

According to the first example, when the substrate processing is switched from the high temperature treatment to the temperature maintained treatment, the distance between the heater 8 and the substrate W is changed from L1 to L2 (>L1). Accordingly, the heater 8 is away from the substrate W and the treatment liquid on the surface, and the amount of heat to them from the heater 8 is reduced. With this, the treatment liquid on the surface of the substrate W can be kept at a desired temperature. In this manner, the distance between the heater 8 and the substrate W, rather than the heating temperature, is changed during the processing by the movement of the heater 8, thereby enabling quick adjustment of the temperature of the treatment liquid. Thus, it is possible to apply a treatment to the substrate as well as adjusting (controlling) the temperature of the treatment liquid during the treatment.

While the first example describes a case of cleaning the substrate W which requires high temperature treatment, the treatment can be applied to different types of substrates with different treatment temperatures, for example, a substrate that requires cleaning by high temperature treatment and a substrate that require cleaning at a predetermined temperature lower than the temperature required in the high temperature treatment. In this case, for cleaning the latter substrate, the heater 8 may be positioned at a predetermined height higher than the high temperature treatment position and lower than the standby position to supply a treatment liquid to the surface of the substrate. Then, the treatment liquid supplied to the surface of the substrate may be heated by the radiation heat of the heater 8 to a predetermined temperature lower than the temperature required for the high temperature treatment. Alternatively, after the treatment liquid is heated from the high temperature treatment position for a time shorter than the heating time of the treatment liquid for high temperature treatment, the heater 8 may be moved to a height above the temperature maintained treatment position in the first example to maintain the temperature of the treatment liquid.

The heater 8 is described above as being driven after moved to the high temperature treatment position. However, the heater 8 may be driven from when in the standby position before moved to the high temperature treatment position, if it takes time to raise the temperature of the heater 8. It may also be driven during the movement from the standby position to the high temperature treatment position (in an extreme case, it may be driven always).

In the second example, the process up to the liquid supply and the high temperature treatment (see FIGS. 2 and 3) is the same as described above. After the high temperature treatment, as illustrated in FIG. 4, the heater 8 is moved from the high temperature treatment position to the low temperature treatment position by the movement mechanism 9. With this, the back surface of the heater 8 is separated from the surface of the substrate W on the support 4 by the predetermined distance L2 (>L1). At this time, unlike the first example, the heater 8 is not driven to maintain the temperature.

Figure 5:
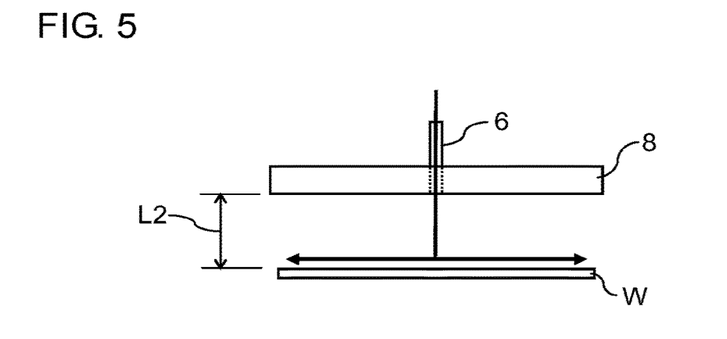
FIG. 5 is a diagram illustrating a fourth step for explaining the flow of substrate processing of the first embodiment.

After the movement of the heater 8, as illustrated in FIG. 5, the treatment liquid is supplied from the liquid supply unit 7A and ejected to the substrate W on the support 4 from the nozzle 6. Thereby, the treatment liquid is supplied to the surface of the rotating substrate W. Besides, the rotational speed of the substrate W on the support 4 is increased to a predetermined speed (liquid supply speed). The treatment liquid supplied to near the center of the substrate from the nozzle 6 spreads to the edge of the substrate by centrifugal force. At this time, on the surface of the substrate W, the hot treatment liquid is replaced by the low temperature treatment liquid (liquid film), and the substrate W is cooled to the temperature of the treatment liquid.

Depending on the content of the processing, after the heater 8 has moved to the low temperature treatment position, the substrate W may be supplied with a treatment liquid the same as or different from the treatment liquid supplied to the substrate W in the process of the high temperature treatment. For example, pure water may be used in both the high temperature treatment and the low temperature treatment. For another example, the low temperature treatment may be performed using pure water after the high temperature treatment using ozone water.

After the heater 8 has moved to the low temperature treatment position, the supply amount of the treatment liquid may be increased from the supply amount in the high temperature treatment position. In addition, the temperature of the treatment liquid may be lower than the temperature of the treatment liquid supplied in the high temperature treatment position. In this case, it is possible to reduce the time taken to replace the treatment liquid by the low temperature treatment liquid. Besides, when the supply amount of the treatment liquid is increased, the rotational speed of the substrate W may be increased from the rotational speed (liquid supply speed) in the high temperature treatment position as well as increasing the supply amount.

After the substrate W is cooled, the heater 8 is driven by the controller 10, and as in the first example, the substrate W on the support 4 and the treatment liquid on the surface of the substrate W (or at least the treatment liquid) are kept warm by the radiant heat of the heater 8 (see FIG. 4). As a result, the treatment liquid on the surface of the substrate W is maintained at a desired temperature.

According to the second example, when the substrate processing is switched from the high temperature treatment to the low temperature treatment, the distance between the heater 8 and the substrate W is changed from L1 to L2 (>L1), and the treatment liquid is supplied to the surface of the substrate W. Accordingly, the heater 8 is away from the treatment liquid on the surface of the substrate W, and the temperature of the substrate W is lowered by the supply of the treatment liquid. As a result, the temperature of the treatment liquid drops quickly on the surface of the substrate W. In this manner, the distance between the heater 8 and the substrate rather than the heating temperature of the heater 8, is changed by the movement of the heater 8, and the treatment liquid is supplied to the surface of the substrate W, thereby enabling quick adjustment of the temperature of the treatment liquid. Thus, it is possible to apply a treatment to the substrate as well as adjusting (controlling) the temperature of the treatment liquid during the treatment.

In particular, if the substrate processing includes a process in which high temperature treatment is switched to low temperature treatment, the heater 8 is moved away from the substrate W to perform the low temperature treatment after the high temperature treatment, and then the treatment liquid is supplied. By only this way, the temperature of the substrate W, i.e., the temperature of the treatment liquid on the substrate W, can be reduced quickly to a predetermined level. This eliminates the need to interrupt the processing until the temperature of the substrate drops from a high level to a predetermined temperature. Even if the processing is interrupted, the time can be reduced as compared to the conventional processing, resulting in less processing time. Besides, when the temperature of the treatment liquid (liquid temperature) continues to rise until stabilized as in the paddle treatment in which the treatment liquid on the surface of the substrate W is heated while the supply of the treatment liquid is stopped as described above, the difference between the temperature of the treatment liquid after stabilized (high temperature) and that at the initial heating (low temperature) is rather large. Nevertheless, the waiting time until the temperature changes from high to low is not required or shorter, and thus, the processing time can be further reduced.

Incidentally, the heater 8 is described above as not being driven while being moved from the high temperature treatment position to the low temperature treatment position when the movement of the heater 8 to the low temperature treatment position and also the supply of the treatment liquid take place; however, it may be being driven.

The edge of the substrate is easily affected by the temperature of the surrounding atmosphere, and the temperature tends to drop easily. Therefore, a temperature difference is caused between the center and edge of the substrate, resulting in non-uniform substrate processing efficiency (substrate processing performance) on the surface of the substrate. If this tendency is strong and thus poses a problem, for example, the heating wire of the heater is divided between the center and edge of the substrate to control the individual heating values. Specifically, the edge of the substrate is heated by a higher temperature as compared to the center. This can prevent the edge of the substrate from being cooled below the temperature of the center. Thus, the surface temperature of the substrate W can be uniform by adjusting the temperature of each part of the substrate W according to the location. Thus, it is possible to suppress the non-uniform substrate processing efficiency due to the temperature difference on the substrate surface.

Incidentally, the temperature difference in the substrate W may be eliminated by changing the placement density of heating wires of the heater 8 according to the location as well as controlling the heating values of the heating wires as described above. For example, the installation density of the heating wires is increased in a place facing the edge of the substrate where the temperature is prone to drop. On the other hand, the installation density is reduced in a place facing the center of the substrate where the temperature is less likely to drop. The installation density of the heating wires may be gradually increased toward the edge from the center of the substrate W.

As described above, according to the first embodiment, the heater 8 is moved in directions toward and away from the substrate W on the support 4. That is, the distance between the heater 8 and the substrate W on the support 4 is changed by the movement of the heater 8. This enables quick adjustment of the temperature of the substrate W, i.e., the temperature of the treatment liquid on the substrate W without adjusting the heating temperature of the heater 8. Thus, the substrate processing can be performed by adjusting the temperature of the treatment liquid during the processing.

If the substrate processing includes a process in which high temperature treatment is switched to low temperature treatment, the heater 8 is moved away from the substrate W to perform the low temperature treatment after the high temperature treatment, and then the treatment liquid is supplied. By only this way, the temperature of the treatment liquid on the substrate W can be reduced quickly to a predetermined level. This eliminates the need to interrupt the processing until the temperature of the substrate drops from a high level to a predetermined temperature. Even if the processing is interrupted, the time can be reduced as compared to the conventional processing, resulting in less processing time.

(Second Embodiment)

A second embodiment will be described with reference to FIG. 6.

The second embodiment is basically similar to the first embodiment. Therefore, in the second embodiment, a description is given only of differences from the first embodiment. Like parts as described in the first embodiment are designated by like reference numerals, and the description thereof is omitted.

Figure 6:
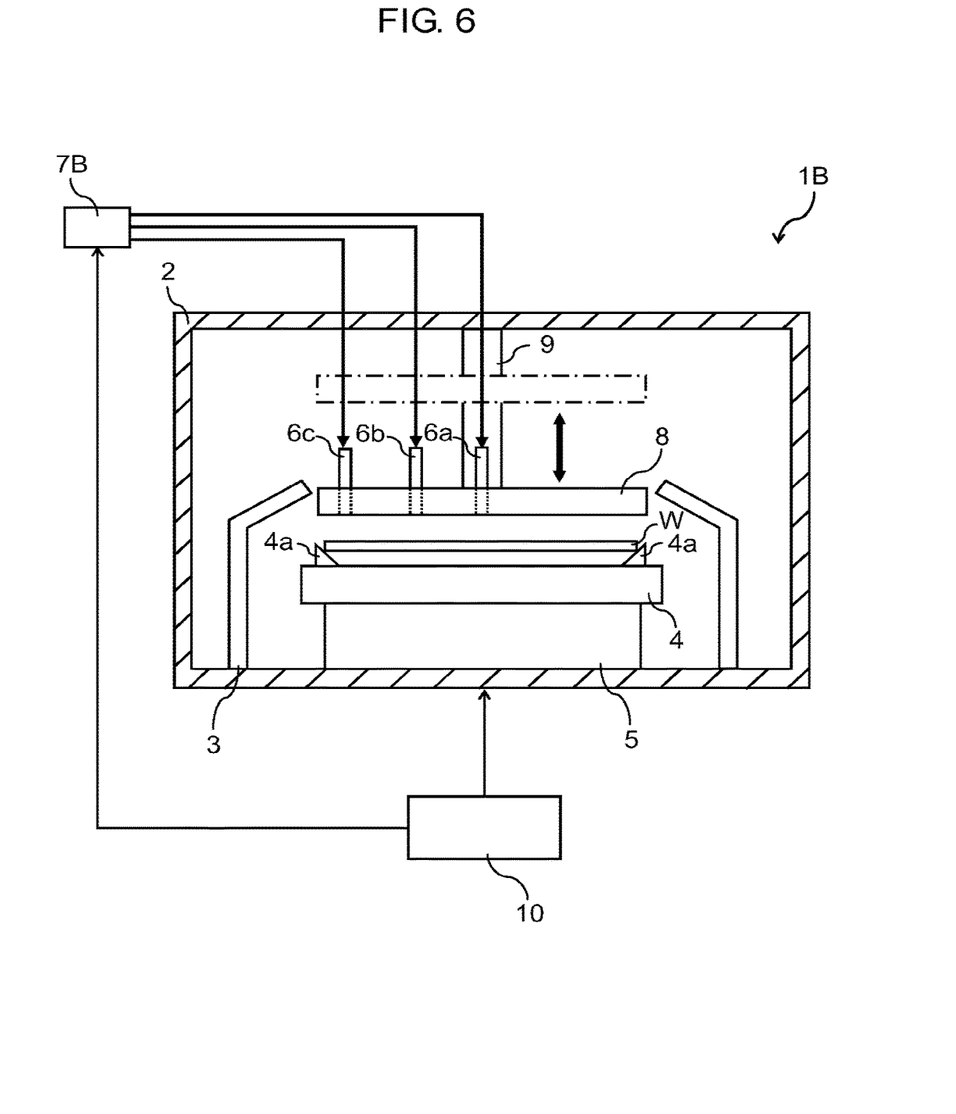
FIG. 6 is a diagram illustrating a schematic structure of a substrate processing apparatus according to a second embodiment.

As illustrated in FIG. 6, a substrate processing apparatus 1B of the second embodiment includes a plurality of nozzles 6a, 6b and 6c. The nozzles 6a, 6b and 6c are aligned along the surface of the substrate W on the support 4 from the center toward the periphery (outer circumference) of the substrate W. The nozzles 6a, 6b and 6c are located above the surface of the substrate W on the support 4. Besides, the nozzles 6a, 6b and 6c are supported by the heater 8, and move vertically together with the vertical movement of the heater 8. The nozzles 6a, 6b and 6c are supplied with the treatment liquid from a liquid supply unit 7B and eject it toward the surface of the rotating substrate W on the support 4 from above the substrate W to supply the surface with the treatment liquid.

Each of the nozzles 6a, 6b and 6c is made of a material that is not deformed by heat, such as, for example, quartz that is not deformed by the heat of the heater 8. Although FIG. 1 illustrates three nozzles, this number of them is exemplary only and not limited in particular.

The nozzle 6a is arranged as a first nozzle in a position facing near the center (central area) of the surface of the substrate W on the support 4. The nozzle 6b is arranged as a second nozzle in a position facing near the center of the radius (radius central area) of the surface of the substrate W on the support 4. The nozzle 6c is arranged as the third nozzle in a position facing near the periphery (peripheral area) of the surface of the substrate W on the support 4.

The nozzles 6a, 6b and 6c are arranged in a straight line extending radially along the surface of the substrate W on the support 4. However, the nozzles 6a, 6b and 6c need not necessarily be arranged in a straight line. For example, the nozzles 6a, 6b and 6c may be alternately arranged to straddle the line. It suffices that the nozzles 6a, 6b and 6c are arranged on the circumferences of three circles having different diameters on the surface of the substrate W.

The liquid supply unit 7B includes a tank for storing the treatment liquid, a pump as a driving source, and a regulating valve for regulating the supply amount (all not illustrated). The liquid supply unit 7B supplies each of the nozzles 6a, 6b and 6c with a treatment liquid by the drive of the pump. The liquid supply unit 7B is electrically connected to the controller 10, and operates under the control of the controller 10. Incidentally, the three nozzles 6a, 6b and 6c supply the same treatment liquid.

When the heater 8 is brought close to the substrate W to treat the substrate W, the high rotational speed of the substrate W causes a different film thickness distribution of the treatment liquid on the surface of the substrate W. This makes it difficult to uniformly treat the surface of the substrate W. Particularly, if the treatment liquid is supplied from only the nozzle 6a facing near the center of the substrate W, the liquid film gradually becomes thinner from around the center of the substrate W toward the periphery. In addition, the supply amount of the treatment liquid is reduced in the periphery. The thin liquid film leads to a decrease in heating efficiency of the heater 8. Accordingly, the substrate processing efficiency (substrate processing performance) may be reduced compared to near the center.

In this regard, a plurality of liquid supply positions are provided relative to the surface of the substrate W from the center toward the periphery (outer circumference) of the substrate W. By controlling the flow amount of the treatment liquid at each position to form a liquid film of a uniform thickness on the surface of the substrate W, the surface of the substrate W can be uniformly treated (e.g., cleaned, etched, etc.). In other words, the liquid film can be maintained even in the periphery of the substrate W similarly to around the center. Since the same amount of liquid can be supplied and the same heating efficiency can be achieved anywhere on the surface of the substrate W, the surface of the substrate W can be processed uniformly.

If the treatment liquid is supplied from only the nozzle 6a facing near the center of the substrate W, the treatment liquid may keep being supplied until the treatment is completed in the periphery of the substrate to uniformly treat the surface of the substrate W. in this case, however, the processing time becomes correspondingly longer, and a large amount of the treatment liquid is consumed. On the other hand, if there are a plurality of liquid supply positions as described above, the surface of the substrate W can be processed uniformly. Thus, it is possible to realize a reduction in the processing time as well as the consumption of the treatment liquid.

Besides, the nozzles 6a, 6b and 6c are located directly above the substrate W on the support 4. Therefore, even if the flow rate of the treatment liquid being supplied is low, the liquid can be easily supplied to the surface of the substrate W. Moreover, even if the flow amount of the treatment liquid being supplied is reduced, the surface of the substrate W can be coated with the liquid. Thus, the consumption of the treatment liquid can be reduced.

Depending on the content of the processing, high temperature treatment and low temperature treatment may be repeated several times. For another example, high temperature treatment may be performed after low temperature treatment. That is, the number of times high temperature treatment and low temperature treatment are repeated, the order to perform high temperature treatment and low temperature treatment, and the like can be set as appropriate.

As described above, according to the second embodiment, the same effect as in the first embodiment can be achieved. Besides, the nozzles 6a, 6b and 6c are aligned along the surface of the substrate W on the support 4 from the center toward the periphery of the substrate W. Accordingly, a plurality of liquid supply positions are provided relative to the surface of the substrate W from the center toward the periphery of the substrate W. Thereby, the surface of the substrate W can be uniformly supplied with a treatment liquid, and therefore can be treated uniformly. Thus, the non-uniform substrate processing efficiency can be reliably prevented.

In the second embodiment described above, the flow amount of the treatment liquid is set for each of the nozzles 6a, 6b and 6c so that the treatment liquid forms a uniform liquid film on the surface of the substrate W. In this case, for example, the flow amount of the treatment liquid for the nozzles 6a, 6b and 6c may be increased in the order from the center toward the periphery of the substrate W. Thus, the surface of the substrate W can be reliably treated uniformly.

The flow amount of the treatment liquid may be adjusted by regulating the opening degree of each of regulating valves arranged in a pipe leading to the nozzle 6a, a pipe leading to the nozzle 6b, and a pipe leading to the nozzle 6c (all not illustrated) to adjust the amount of the treatment liquid to be ejected from the nozzles 6a, 6b and 6c.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:
1. A substrate processing apparatus comprising:
 a support member configured to support a substrate;
 a rotation mechanism configured to rotate the support member about an axis that crosses the substrate supported by the support member;

a nozzle configured to supply a first treatment liquid to a surface of the substrate on the support member being rotated by the rotation mechanism;

a heater located above the substrate supported by the support member to heat the substrate supported by the support member at a distance from the substrate;

a motor configured to move the heater in directions toward and away from the substrate supported by the support member; and a control circuit configured to control the motor to move the heater to a first position where the heater heats the first treatment liquid on the surface of the substrate while in contact with the first treatment liquid, to a standby position above the first position, and to a second position between the first position and the standby position, the second position being a position where the heater is not in contact with the first treatment liquid on the surface of the substrate, wherein the control circuit is configured such that, when the heater is located at the second position, the nozzle supplies a second treatment liquid, which is the same as or different from the first treatment liquid, to the surface of the substrate while first treatment liquid is present on the surface of the substrate.

2. The substrate processing apparatus according to claim 1, wherein more than one nozzle is provide and the plurality of nozzles are aligned from center toward periphery of the substrate.

3. The substrate processing apparatus according to claim 2, wherein a flow amount of the treatment liquid is set for each of the nozzles such that the treatment liquid forms a uniform liquid film on the surface of the substrate.

4. The substrate processing apparatus according to claim 3, wherein the flow amount of the treatment liquid set for the nozzles is increased in order from the center toward the periphery of the substrate.

5. A substrate processing method comprising:

a first step of rotating a substrate, which faces a heater at a distance therefrom, in a horizontal plane;

a second step of supplying a first treatment liquid from a nozzle to a surface of the substrate being rotated;

a third step of heating the substrate and the first treatment liquid on the surface of the substrate by the heater;

a fourth step of moving the heater away from the substrate; and a fifth step of supplying a second treatment liquid, which is the same as or different from the first treatment liquid, from the nozzle to the surface of the substrate being rotated in a state that the heater is away from the substrate, wherein in the third step, the heater is moved to a first position where the heater heats the first treatment liquid on the surface of the substrate while in contact with the first treatment liquid, in the fourth step, the heater is moved to a second position between the first position and a standby position above the first position, the second position being a position where the heater is not in contact with the first treatment liquid on the surface of the substrate, and in the fifth step, when the heater is located at the second position, the second treatment liquid is supplied from the nozzle to the surface of the substrate while first treatment liquid is present on the surface of the substrate.

6. The substrate processing method according to claim 5, wherein in the second step, the treatment liquid is supplied to the surface of the substrate being rotated from a plurality of nozzles which are aligned from center toward periphery of the substrate.

7. The substrate processing method according to claim 6, wherein a flow amount of the treatment liquid is set for each of the nozzles such that the treatment liquid forms a uniform liquid film on the surface of the substrate.

8. The substrate processing method according to claim 7, wherein a flow amount of the treatment liquid set for the nozzles is increased in order from the center toward the periphery of the substrate.

9. The substrate processing apparatus according to claim 1, wherein the heater is not driven when at the second position.

10. The substrate processing apparatus according to claim 1, wherein the heater is formed in a plate-like shape larger than a plane size of the substrate.

11. The substrate processing apparatus according to claim 1, wherein the control circuit is further configured to control the motor to move the heater to the second position after moving the heater to the first position with respect to one substrate.

12. The substrate processing apparatus according to claim 1, wherein the control circuit is further configured to drive the heater in the standby position, and to control the motor to move the driving heater to the first position.

13. The substrate processing apparatus according to claim 1, wherein the first treatment liquid is ozone water, and the second treatment liquid is pure water.

14. The substrate processing method according to claim 5, wherein the first treatment liquid is ozone water, and the second treatment liquid is pure water.

* * * * *